United States Patent
Sung et al.

(10) Patent No.: US 10,133,179 B2
(45) Date of Patent: *Nov. 20, 2018

(54) PATTERN TREATMENT METHODS

(71) Applicants: Rohm and Haas Electronic Materials LLC, Marlborough, MA (US); Dow Global Technologies LLC, Midland, MI (US)

(72) Inventors: Jin Wuk Sung, Northborough, MA (US); Mingqi Li, Shrewsbury, MA (US); Jong Keun Park, Shrewsbury, MA (US); Joshua A. Kaitz, Brighton, MA (US); Vipul Jain, North Grafton, MA (US); Chunyi Wu, Shrewsbury, MA (US); Phillip D. Hustad, Natick, MA (US)

(73) Assignees: Rohm and Haas Electronic Materials LLC, Marlborough, MA (US); Dow Global Technologies LLC, Midland, MI (US)

( * ) Notice: Subject to any disclaimer, the term of this patent is extended or adjusted under 35 U.S.C. 154(b) by 88 days.

This patent is subject to a terminal disclaimer.

(21) Appl. No.: 15/224,503

(22) Filed: Jul. 29, 2016

(65) Prior Publication Data
US 2018/0031975 A1    Feb. 1, 2018

(51) Int. Cl.
| | |
|---|---|
| C09D 153/02 | (2006.01) |
| G03F 7/40 | (2006.01) |
| C09D 153/00 | (2006.01) |
| G03F 7/038 | (2006.01) |
| G03F 7/20 | (2006.01) |
| G03F 7/32 | (2006.01) |
| G03F 7/38 | (2006.01) |
| G03F 7/039 | (2006.01) |

(52) U.S. Cl.
CPC ........... *G03F 7/405* (2013.01); *C09D 153/00* (2013.01); *G03F 7/038* (2013.01); *G03F 7/0397* (2013.01); *G03F 7/20* (2013.01); *G03F 7/32* (2013.01); *G03F 7/325* (2013.01); *G03F 7/38* (2013.01)

(58) Field of Classification Search
CPC ... C09D 153/005; C09D 153/00; G03F 7/038; G03F 7/0397
USPC ........................................................ 430/315
See application file for complete search history.

(56) References Cited

U.S. PATENT DOCUMENTS

| | | | |
|---|---|---|---|
| 7,384,852 B2 | 6/2008 | Yang et al. | |
| 9,665,005 B2 * | 5/2017 | Jain | G03F 7/405 |
| 9,684,241 B2 * | 6/2017 | Jain | G03F 7/168 |
| 2015/0086929 A1 | 3/2015 | Hatakeyama et al. | |
| 2015/0338744 A1 | 11/2015 | Hatakeyama et al. | |
| 2016/0033869 A1 | 2/2016 | Hustad et al. | |
| 2016/0195814 A1 | 7/2016 | Enomoto et al. | |

FOREIGN PATENT DOCUMENTS

JP    2007121346 A    5/2007

OTHER PUBLICATIONS

Cheng, et al, "EUVL compatible, LER solutions using functional block copolymers", Proc. of SPIE, 2012, pp. 83231O-1 thru 83231O-11, vol. 8323.
Namie, et al, "Polymer blends for directed self-assembly", Proc. of SPIE, 2013, pp. 86801M-1 thru 86801M-5, vol. 8680.
Oyama, et al, "The enhanced photoresist shrink process technique toward 22nm node", Proc. of SPIE, 2011, pp. 79722Q-1 thru 79722Q-6, vol. 7972.
Chuang, et al, "Using directed self assembly of block copolymer nanostructures to modulate nanoscale surface roughness: towards a novel lithographic process", Adv. Funct. Mater., 2013, pp. 173-183, vol. 23.
Co-pending U.S. Appl. No. 15/172,228, filed Jun. 3, 2016.
Co-Pending U.S. Appl. No. 15/172,276, filed Jun. 3, 2016.
Search report for corresponding Taiwan Application No. 106122283 dated Jul. 13, 2018.

* cited by examiner

*Primary Examiner* — Daborah Chacko-Davis
(74) *Attorney, Agent, or Firm* — Jonathan D. Baskin

(57) ABSTRACT

A pattern treatment method, comprising: (a) providing a semiconductor substrate comprising a patterned feature on a surface thereof; (b) applying a pattern treatment composition to the patterned feature, wherein the pattern treatment composition comprises: a block copolymer and an organic solvent, wherein the block copolymer comprises: (i) a first block comprising a first unit formed from 4-vinyl-pyridine, and (ii) a second block comprising a first unit formed from a vinyl aromatic monomer; and (c) removing residual pattern shrink composition from the substrate, leaving a coating of the block copolymer over the surface of the patterned feature, thereby providing a reduced pattern spacing as compared with a pattern spacing of the patterned feature prior to coating the pattern treatment composition. The methods find particular applicability in the manufacture of semiconductor devices for providing high resolution patterns.

11 Claims, 2 Drawing Sheets

PATTERN TREATMENT METHODS

FIELD OF THE INVENTION

The invention relates generally to the manufacture of electronic devices. More specifically, this invention relates to methods and compositions for treating patterns. The methods and compositions find particular use in the manufacture of semiconductor devices in negative tone development (NTD) shrink processes for the formation of fine patterns.

BACKGROUND OF THE INVENTION

In the semiconductor manufacturing industry, photoresist materials are used for transferring an image to one or more underlying layer, such as metal, semiconductor and dielectric layers, disposed on a semiconductor substrate, as well as to the substrate itself. To increase the integration density of semiconductor devices and allow for the formation of structures having dimensions in the nanometer range, photoresists and photolithography processing tools having high-resolution capabilities have been and continue to be developed.

Positive-tone chemically amplified photoresists are conventionally used for high-resolution processing using a positive tone development (PTD) process. In the PTD process, exposed regions of a photoresist layer are soluble in a developer solution, typically an aqueous alkaline developer, and are removed from the substrate surface, whereas unexposed regions which are insoluble in the developer remain after development to form a positive image. To improve lithographic performance, immersion lithography tools have been developed to effectively increase the numerical aperture (NA) of the lens of the imaging device, for example, a scanner having a KrF or ArF light source. This is accomplished by use of a relatively high refractive index fluid (i.e., an immersion fluid) between the last surface of the imaging device and the upper surface of the semiconductor wafer.

Considerable effort has been made to extend the practical resolution beyond that achieved with positive tone development from both a materials and processing standpoint. One such example is the negative tone development (NTD) process. The NTD process allows for improved resolution and process window as compared with standard positive tone imaging by making use of the superior imaging quality obtained with bright field masks for printing critical dark field layers. NTD resists typically employ a resin having acid-labile (also referred to herein as acid-cleavable) groups and a photoacid generator. Exposure to actinic radiation causes the photoacid generator to form an acid which, during post-exposure baking, causes cleavage of the acid-labile groups giving rise to a polarity switch in the exposed regions. As a result, a difference in solubility characteristics is created between exposed and unexposed regions of the resist such that unexposed regions of the resist can be removed by organic solvent developers, leaving behind a pattern created by the insoluble exposed regions.

To further extend resolution capabilities beyond those typically obtained with standard resist patterning techniques, various processes for pattern shrink have been proposed. These processes involve increasing the effective thickness of the resist pattern sidewalls to reduce (i.e., "shrink") the spacing, for example, between adjacent lines or within a trench or hole pattern. In this way, features such as trenches and contact holes formed from the patterns can be made smaller. Known shrink techniques include, for example, chemical vapor deposition (CVD) assist, acid diffusion resist growth (RELACS), thermal flow and polymer blend directed self-assembly (DSA) and polymer grafting approaches.

The CVD assist shrink process (see K. Oyama et al, "The enhanced photoresist shrink process technique toward 22 nm node", *Proc. SPIE* 7972, Advances in Resist Materials and Processing Technology XXVIII, 79722Q (2011)), uses a CVD-deposited layer formed over a photoresist pattern including, for example, contact hole, line/space or trench patterns. The CVD material is etched back, leaving the material on sidewalls of the resist pattern. This increases the effective lateral dimensions of the resist pattern, thereby reducing the open areas that expose the underlying layer to be etched. The CVD assist shrink technique requires use of CVD and etching tools which are costly, add to the complexity of the process and are disadvantageous in terms of process throughput.

In the acid diffusion resist growth process, also referred to as the RELACS process (see L. Peters, "Resists Join the Sub-λ Revolution", *Semiconductor International,* 1999. 9), an acid-catalyzed cross-linkable material is coated over a PTD-generated resist patterned surface. Cross-linking of the material is catalyzed by an acid component present in the resist pattern that diffuses into the cross-linkable material during a baking step. The cross-linking takes place in the material in the vicinity of the resist pattern in the acid diffusion region to form a coating on sidewalls of the pattern, thereby reducing the lateral dimension of open areas of the pattern. This process typically suffers from proximity (or iso-dense) bias, wherein growth of the cross-linked layer on the resist pattern occurs non-uniformly across the die surface depending on density (spacing between) adjacent resist patterns. As a result, the extent of "shrink" for identical features can vary across die based on pattern density. This can lead to patterning defects and variations in electrical characteristics across the die for what are intended to be identical devices.

Polymer blend self-assembly (see Y. Namie et al, "Polymer blends for directed self-assembly", *Proc. SPIE* 8680, Alternative Lithographic Technologies V, 86801M (2013)) involves coating a composition containing an immiscible blend of hydrophilic and hydrophobic polymers over the photoresist pattern. The composition is then annealed, causing the polymers to phase separate, wherein the hydrophilic polymer preferentially segregates to the resist pattern sidewalls and the hydrophobic polymer fills the remainder of the volume between the resist pattern sidewalls. The hydrophobic polymer is next removed by solvent development, leaving the hydrophilic polymer on the resist pattern sidewalls. Polymer blend self-assembly has been found to suffer from proximity and size effects. As the shrink ratio is determined by the volume ratio of the two polymers, all features shrink by the same relative percentage rather than by the same absolute amount. This can lead to the same problems described with respect to the acid diffusion resist growth technique.

A polymer grafting NTD-shrink process, in which a block copolymer is grafted to an NTD-generated photoresist pattern, has been disclosed, for example, in US 2016-0033869 A1.

There is a continuing need in the art for improved pattern treatment methods and pattern treatment compositions which address one or more problems associated with the state of the art and which allow for the formation of fine patterns in electronic device fabrication.

SUMMARY

In accordance with a first aspect of the invention, pattern treatment methods are provided. The methods comprise: (a) providing a semiconductor substrate comprising a patterned feature on a surface thereof; (b) applying a pattern treatment composition to the patterned feature, wherein the pattern treatment composition comprises: a block copolymer and an organic solvent, wherein the block copolymer comprises: (i) a first block comprising a first unit formed from 4-vinyl-pyridine, and (ii) a second block comprising a first unit formed from a vinyl aromatic monomer; and (c) removing residual pattern shrink composition from the substrate, leaving a coating of the block copolymer over the surface of the patterned feature, thereby providing a reduced pattern spacing as compared with a pattern spacing of the patterned feature prior to coating the pattern treatment composition.

Also provided are pattern treatment compositions, coated substrates and electronic devices formed by the methods described herein. The invention finds particular applicability in the manufacture of semiconductor devices for providing high resolution patterns.

The terminology used herein is for the purpose of describing particular embodiments only and is not intended to be limiting of the invention. The singular forms "a", "an" and "the" are intended to include singular and plural forms, unless the context indicates otherwise.

Various materials and groups that are "optionally substituted" may be suitably substituted at one or more available positions. Except as otherwise specified, "substituted" shall be understood to mean including at least one substituent such as a halogen (i.e., F, Cl, Br, I), hydroxyl, amino, thiol, carboxyl, carboxylate, ester, ether, amide, nitrile, sulfide, disulfide, nitro, C1 to C18 alkyl, C1 to C18 alkenyl (including norbornenyl), C1 to C18 alkoxyl, C2 to C18 alkenoxyl (including vinyl ether), C4 to C18 aryl, C6 to C18 aryloxyl, C7 to C18 alkylaryl, or C7 to C18 alkylaryloxyl, optionally including one or more heteroatom.

As used herein, the term "alkyl" includes linear alkyl, branched alkyl, cyclic (monocyclic or polycyclic) alkyl, and alkyl groups combining two-way and three-way combinations of linear, branched, and cyclic groups. The initials "b" and "r" as used in polymer structures refer to block and random polymers, respectively.

BRIEF DESCRIPTION OF THE DRAWINGS

The present invention will be described with reference to the following drawings, in which like reference numerals denote like features, and in which.

DETAILED DESCRIPTION

Pattern Treatment Compositions

Figure 1A:
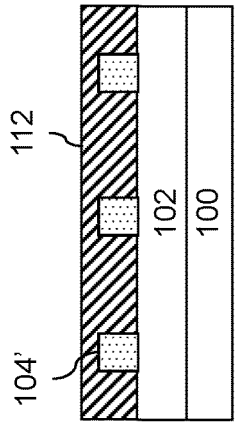
FIG. 1A-F is a process flow for a pattern treatment method in accordance with the invention.

The pattern treatment compositions of the invention include a block copolymer and an organic solvent, and can include one or more additional, optional components. The block copolymer comprises a first block and a second block. The first block comprises a first unit formed from 4-vinyl-pyridine, and (ii) a second block comprising a first unit formed from a vinyl aromatic monomer. The compositions, when coated over a pattern, for example, an NTD-formed photoresist pattern such as a contact hole, trench or line and space pattern, allow for a reduced pattern spacing as compared with a pattern spacing of the patterned feature prior to coating the pattern treatment composition. Suitable pattern treatment compositions may allow for a shrink pattern exhibiting minimal or no proximity bias. The pattern treatment compositions can be coated using a spin-coating tool, thereby allowing for simplified processing and ease in integration with the photoresist patterning process.

The block copolymer is typically made up of units formed from monomers having an ethylenically unsaturated polymerizable group. Preferred such monomers are independently chosen from ethylenically unsaturated polymerizable groups such as vinyl, for example, (C1 to C3 alkyl)acrylate and vinyl aromatic monomers.

Suitable block copolymers for the pattern treatment compositions can include two or more blocks, for example, two, three, four or more blocks. One or more block making up the copolymer can independently be chosen, for example, from linear blocks, branched blocks, star blocks, dendritic blocks, and combinations thereof. Typically, the block copolymer is a linear copolymer, wherein each block of the copolymer is linear. The blocks of the copolymer can be formed, for example, as a homopolymer or as a copolymer containing two or more different units, for example two, three, four or more different units. The block copolymer can optionally be free of halogen-containing groups, for example, bonded fluorine atoms and fluoroalkyl groups. Suitable pattern treatment compositions may also optionally be free of acid labile leaving groups, for example, tertiary alkyl ester groups, and/or fluoroalkyl groups.

The block copolymer is capable of interacting with an NTD-formed photoresist pattern. Without wishing to be bound by any particular theory, it is believed that the block copolymer forms a bond with an acid and/or alcohol group present on the resist pattern surface as a result of deprotection during the resist patterning process. The pyridine group of the copolymer's first block is believed to act as an anchoring group for attachment of the block copolymer to the patterned feature. The pyridine group is a hydrogen acceptor group effective to interact such as by forming a bond with a hydrogen donor group in the patterned feature. The block copolymer has a second block attached directly or indirectly to the first block for adding additional length to the block copolymer for effectively increasing the dimensions of the resist pattern. The second block includes a unit formed from a vinyl aromatic group. The second block can be effective to provide a smooth surface having lower linewidth roughness (LWR) as compared with the resist pattern prior to treatment with the block copolymer.

The first block is typically a homopolymer of 4-vinyl-pyridine, but may be a copolymer containing one or more additional, different units. Suitable such additional units include, for example, units formed from monomers having an ethylenically unsaturated polymerizable group, preferred of which are vinyl, for example, (C1 to C3 alkyl or haloalkyl)acrylates such as fluoroalkylacrylates, and vinyl aromatic groups. In the case the first block is a copolymer, units containing 4-vinyl-pyridine are typically present in the first block in an amount of from 2 to 20 wt %, more typically from 5 to 15 wt %. The first block typically has number average molecular weight Mn of from 500 to 6000 Daltons, more typically from 1000 to 4500 Daltons.

The second block includes a unit formed from a vinyl aromatic monomer. Suitable aromatic groups are not particularly limited, and include monocyclic and/or polycyclic structures. Suitable polycyclic structures can be, for example, of a fused-structure (e.g., naphthyl) or tethered-structure (e.g., biphenyl), or a combination thereof. Suitable aromatic groups include, for example, optionally substituted benzyl, phenyl, biphenyl, naphthyl, anthracenyl, phenanthrenyl, chrysyl, pyryl, benzo[a]pyryl, pyridyl, cumenyl, mesityl, tolyl, xylyl, and derivatives thereof. The aromatic group and optional substituents can independently include one or more heteroatoms. The aromatic group is optionally substituted with one or more substituents chosen, for example, from halo, alkyl and heteroalkyl substituents.

The vinyl aromatic monomer of the second block is preferably of the following general formula (I):

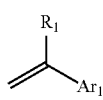
(I)

wherein: $R_1$ is chosen from hydrogen and C1 to C3 alkyl or haloalkyl such as fluoro-, chloro-, iodo- or bromoalkyl, with hydrogen being typical; and $Ar_1$ is chosen from aryl such as C5 to C25, C5 to C15 or C5 to C10 aryl, optionally substituted, for example, with halogen (F, Cl, I or Br), and optionally substituted alkyl such as optionally substituted C1 to C10 linear or branched alkyl or C3 to C8 cyclic alkyl, and optionally including one or more linking moiety chosen, for example, from —O—, —S—, —C(O)O— and —OC(O)—.

The vinyl aromatic monomer can include one or more fused rings, for example, naphthyl, anthracenyl and the like Suitable vinyl aromatic monomers of the formula (I) include monomers chosen, for example, from the following:

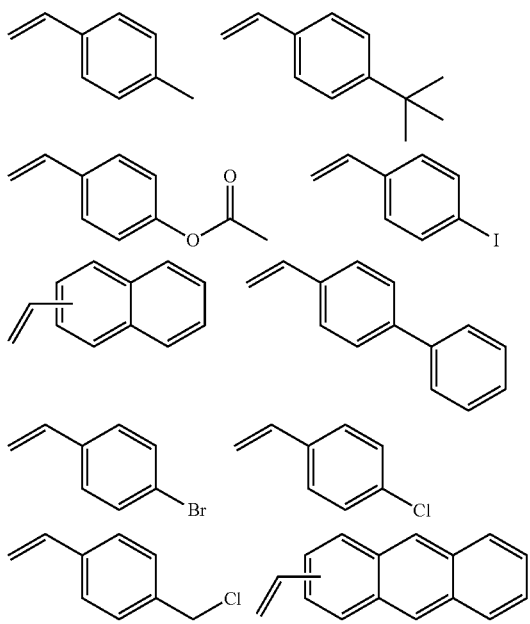

-continued

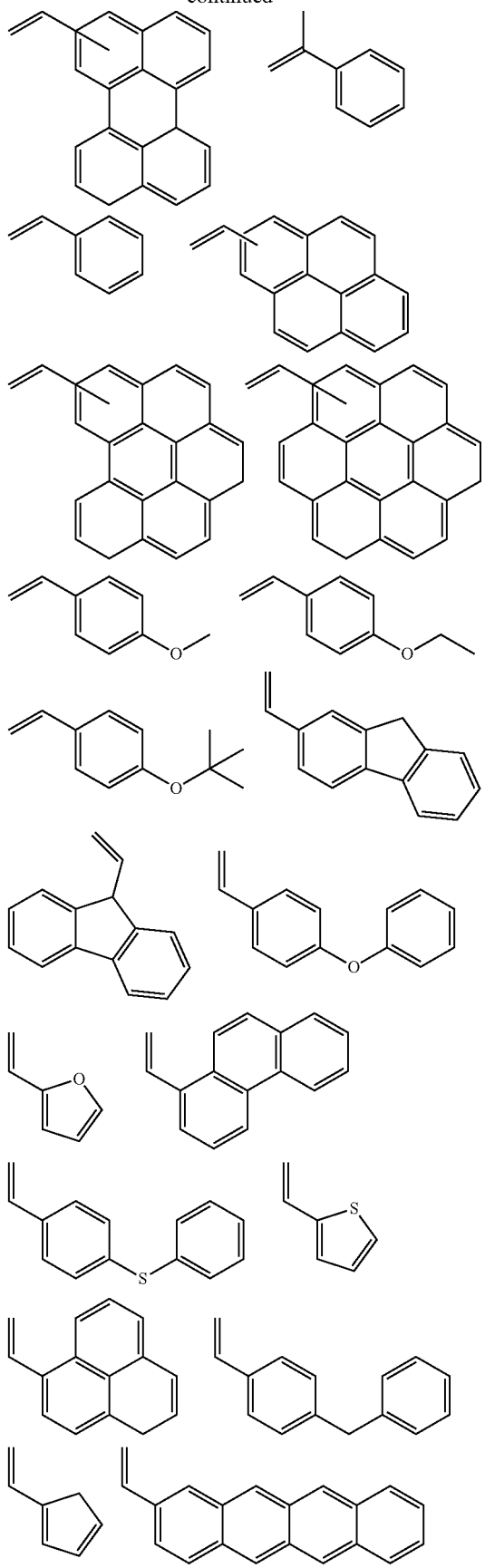

-continued

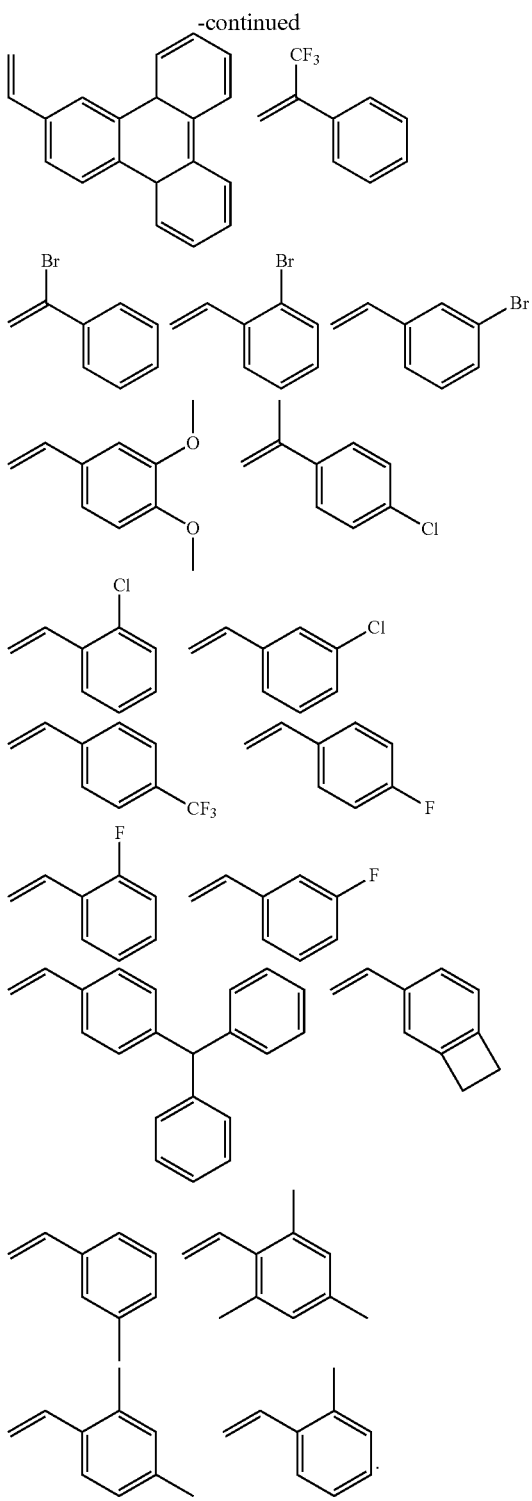

Suitable second blocks for the block copolymer include, for example, homopolymers of the above-described vinyl aromatic monomers. Also suitable are copolymers including a unit formed from a vinyl aromatic monomer as described above, and one or more additional units formed from monomers chosen, for example, from optionally substituted vinyl monomers, optionally substituted (alkyl)acrylate [e.g., (meth)acrylate] monomers and combinations thereof. Suitable copolymers for the second block can be, for example, a random or alternating copolymer. The one or more additional unit(s) can include aromatic and/or aliphatic group(s). Suitable aromatic groups for the additional units for the second block include, for example, those described above with respect to the vinyl aromatic unit. Suitable aliphatic groups can be chosen from saturated and/or unsaturated aliphatic groups. The aliphatic groups can be linear, branched, cyclic, or a combination thereof. Preferable are optionally substituted C1 to C20 linear or branched alkyl, and optionally substituted C3 to C20 cycloalkyl. Suitable cyclic aliphatic groups include monocyclic and polycyclic structures. The polycyclic structure can, for example, be of a fused-, bridge- or tethered-structure. Suitable cyclic aliphatic groups include, for example, groups chosen from optionally substituted cyclopropyl, cyclopentyl, cyclohexyl, adamantyl, 2-methyl-2-adamantyl, norbornyl, bornyl, isobornyl, tricyclodecanyl, dicyclopentenyl, norbornaneepoxy, menthyl, isomenthyl, neomenthyl, and tetracyclododecanyl. Of these, optionally substituted cyclohexyl, adamantyl and norbornyl groups are preferred. In addition to the vinyl aromatic groups described above, suitable monomers for use in forming additional unit(s) in a copolymer for the second block include, for example, the following:

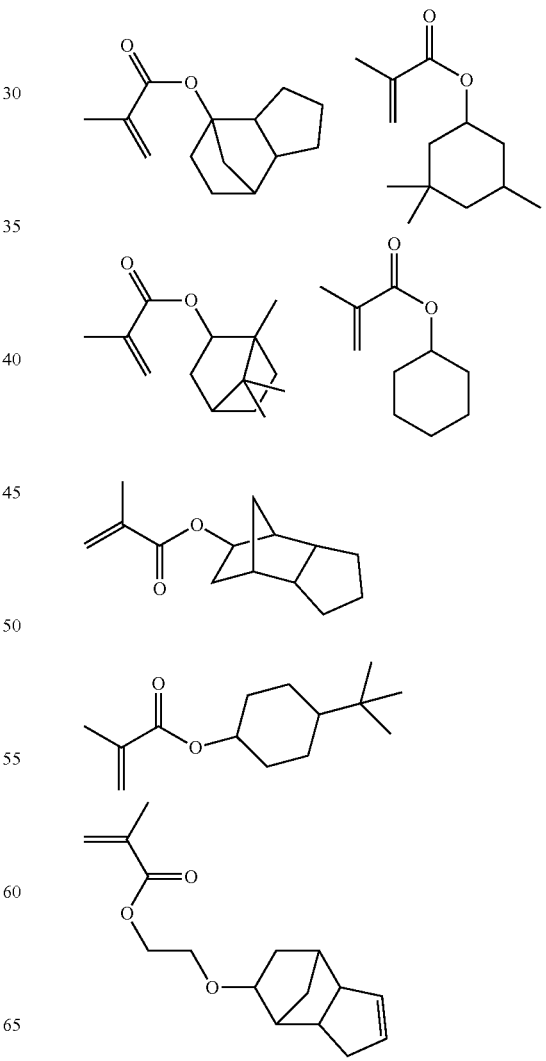

-continued
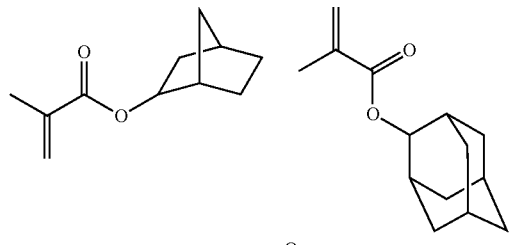
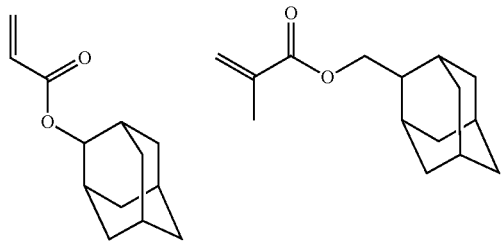
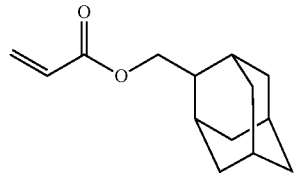
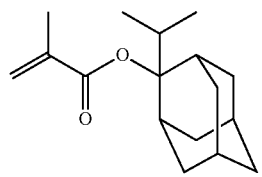
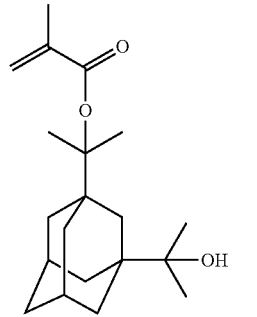
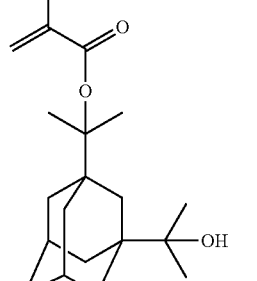
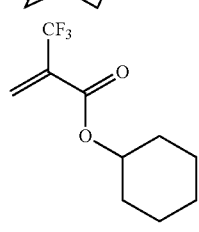
-continued
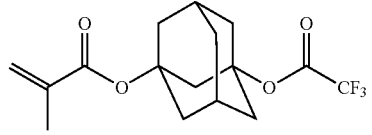
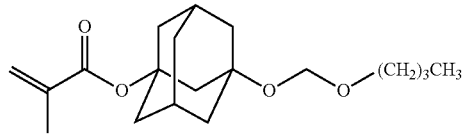
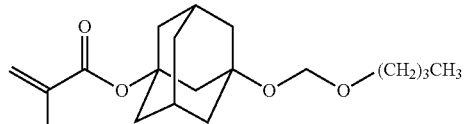
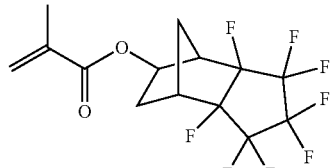
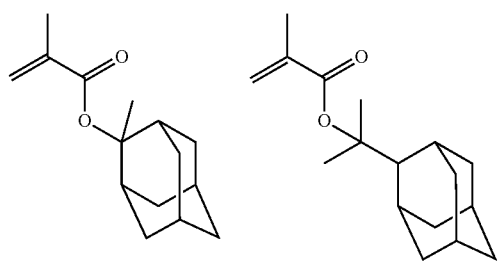
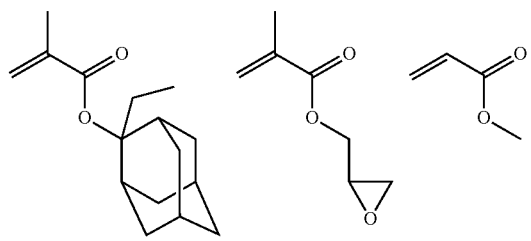
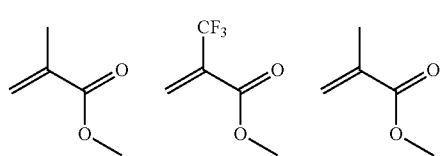
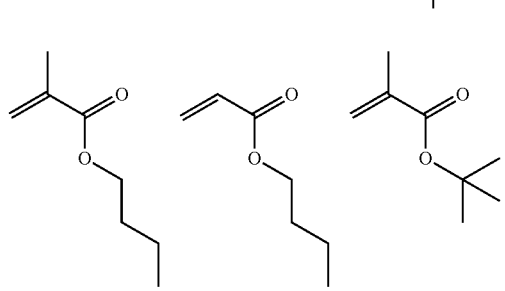

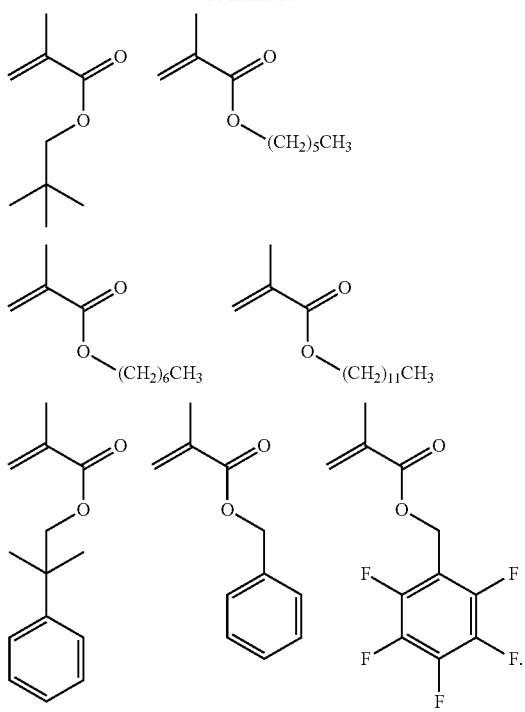
Suitable exemplary second block copolymers include, for example, the following:
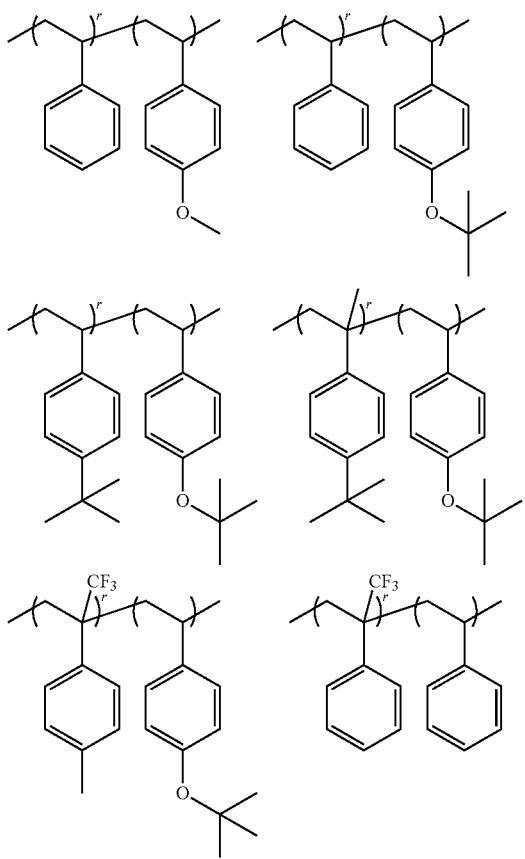
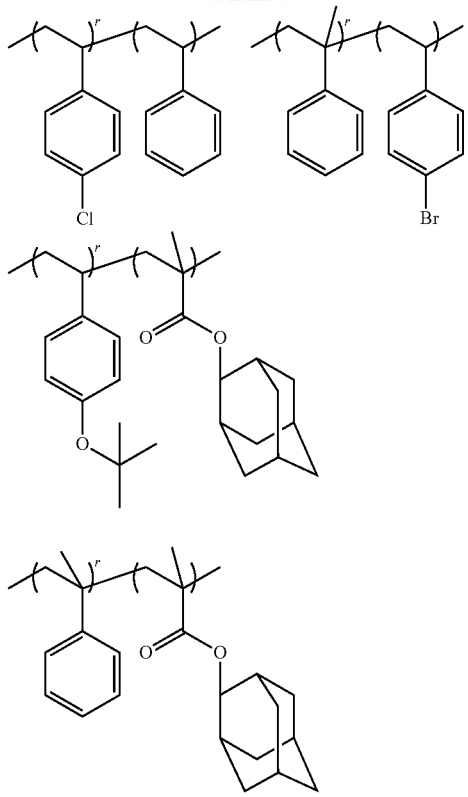
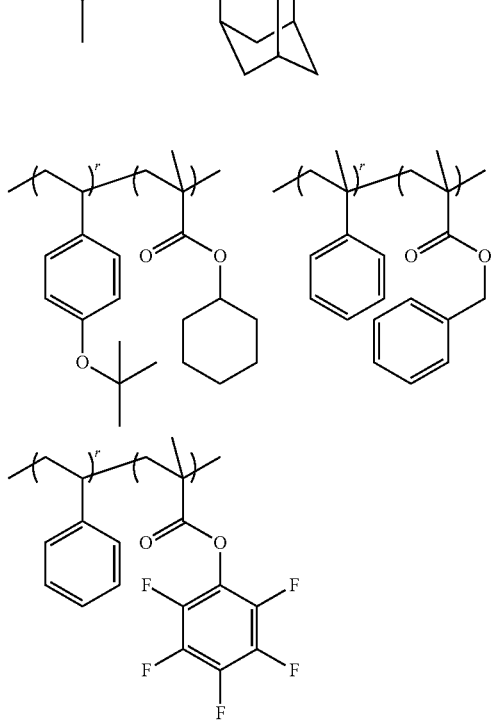

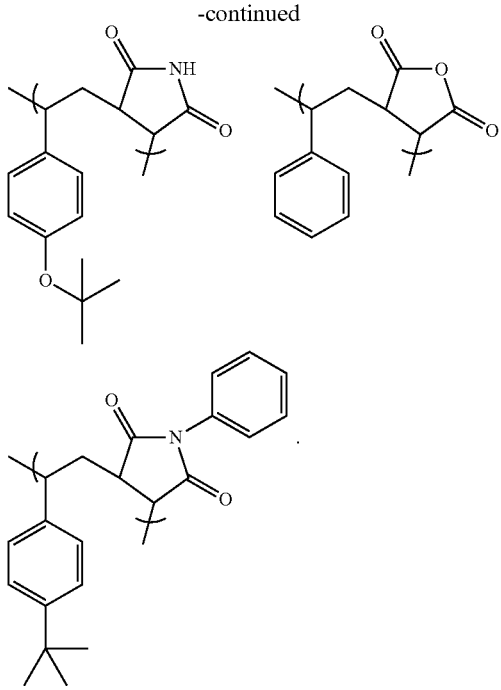

The second block typically has a number average molecular weight Mn of from 3000 to 100,000 Daltons, more typically from 15,000 to 80,000 Daltons. The second block is typically present in the block copolymer in an amount of from 80 to 99 wt %, more typically from 85 to 98 wt %, based on the block copolymer.

One or more additional blocks can optionally be included in the block copolymer. The additional blocks can include, for example, one or more additional blocks of the types described with respect to the second block, and/or can include other types of blocks. For example, a preferred third block includes a unit formed from a vinyl aromatic monomer. The use of additional blocks can be used, for example, to modify the characteristics of the block copolymer such as one or more of shrink (pattern growth) amount, etch resistance, solubility, Tg, and dissolution rate in developer. The additional block preferably is formed from a monomer having an ethylenically unsaturated polymerizable group such as a vinyl group as described above with respect to the first and second blocks. If present, an additional block is typically bonded to the second block.

By selection of a suitable block copolymer, the amount of growth of the polymer on the resist pattern sidewall can be accurately controlled. This thickness can be controlled, for example, by selection of a suitable molecular weight for first, second and optional additional blocks, with higher molecular weights typically resulting in greater thicknesses and lower molecular weights typically resulting in lesser thicknesses. The chemical composition of the block copolymer can also influence the amount of growth. For example, without wishing to be bound by any particular theory, it is believed that polymers with a longer unperturbed end-to-end distance or characteristic ratio provide larger shrink for a given molecular weight.

The block copolymer should have good solubility in an organic solvent used in the composition and an organic solvent used to rinse and remove excess polymer (i.e., polymer not attached to the resist pattern) from the substrate. The content of the block copolymer in the resist treatment composition will depend, for example, on the desired coating thickness of the resist treatment composition. The block copolymer is typically present in the compositions in an amount of from 80 to 100 wt %, more typically from 90 to 100 wt %, based on total solids of the composition. The weight average molecular weight of the polymer is typically less than 400,000, preferably from 5000 to 200,000, more preferably from 1000 to 125,000 g/mol.

The polymer preferably has good etch resistance to facilitate pattern transfer. For carbon based polymers, the "Ohnishi parameter" can generally be used as an indicator of etch resistance of a polymer (J. Electrochem Soc, 143, 130 (1983), H. Gokan, S. Esho and Y. Ohnishi). The Ohnishi parameter is used in general to indicate the carbon density of a polymer and is specifically determined by the following equation:

$$N/(NC-NO) = \text{Ohnishi parameter}$$

where N is the total number of atoms in the polymer, NC is the total number of carbon atoms in the polymer, and NO is the total number of oxygen atoms in the polymer. The increase of the carbon density of a polymer per unit volume (i.e., the decrease of the Ohnishi parameter) improves the etching resistance thereof. The Ohnishi parameter for carbon-based polymers useful in the invention is preferably less than 4, and more preferably less than 3.5, with a range from 1.5 to 4 or 2.0 to 3.5 being typical.

Suitable block copolymers useful in the compositions of the invention include, for example, the following:

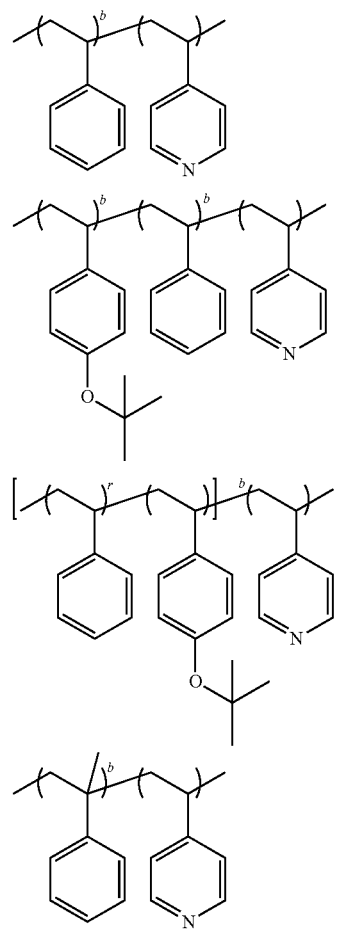

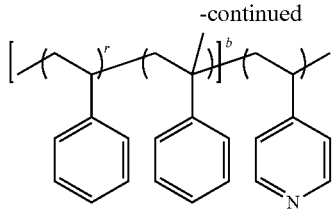

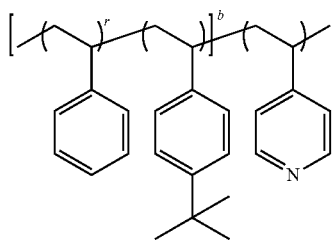

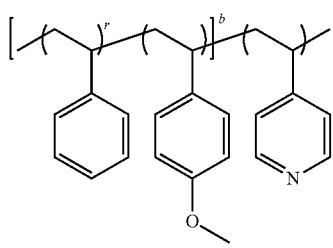

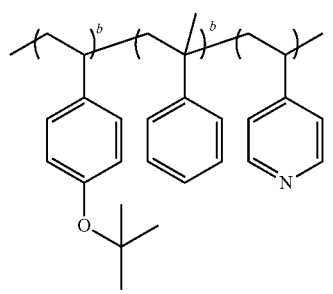

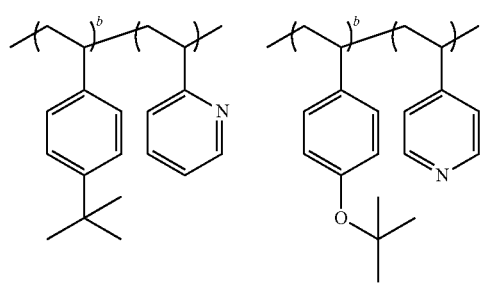

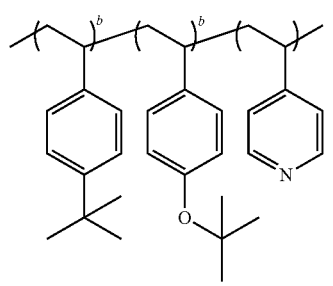

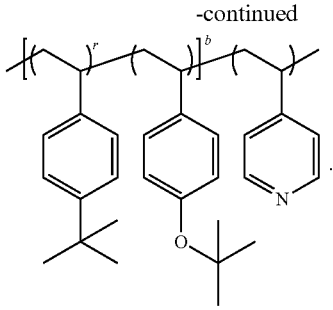

The pattern treatment compositions typically include a single block copolymer, but can optionally include one or more additional block copolymers as described above and/or other polymers. The additional block copolymer(s) can be different from the first block copolymer, meaning that the additional block copolymer contains at least one unit that is structurally different from the first block copolymer.

Suitable block copolymers for use in the pattern treatment compositions can be made by persons skilled in the art. Block copolymers useful in the invention can be synthesized by known techniques such as living anionic polymerization (LAP), reversible addition fragmentation chain transfer (RAFT) or ring opening metathesis (ROMP). Of these, LAP and RAFT are preferred. In the LAP and RAFT techniques for forming a diblock polymer, one block is formed on an initially-formed block after ensuring that the monomer(s) from the initially-formed block are fully consumed during polymerization or cleaned by a purification technique such as precipitation. In the absence of such complete monomer consumption or purification, the residual monomer(s) from the initially-formed block can result in the formation of a gradient or random block. One or more additional blocks can be formed on the diblock polymer using the same techniques for forming the diblock. The block copolymer can be subjected to purification prior to being combined with the other components of the pattern treatment composition for removal of metallic and/or non-metallic impurities. Purification can involve, for example, one or more of washing, slurrying, precipitation, centrifugation, filtration, distillation, decantation, evaporation and treatment with ion exchange beads.

The pattern treatment compositions further include an organic solvent which can be in the form of a single organic solvent or a mixture of organic solvents. Suitable solvent materials to formulate and cast the pattern treatment compositions exhibit excellent solubility characteristics with respect to the non-solvent components of the compositions, but do not appreciably dissolve an underlying photoresist pattern. Suitable organic solvents for the pattern treatment compositions include, for example: alkyl esters such as n-butyl acetate, n-butyl propionate, n-pentyl propionate, n-hexyl propionate, n-heptyl propionate, propylene glycol methyl ether acetate, ethyl lactate, and alkyl butyrates such as hydroxymethyl isobutyrate, n-butyl butyrate, isobutyl butyrate, and isobutyl isobutyrate; ethers such as 2-methoxyethyl ether (diglyme), ethylene glycol monomethyl ether, and propylene glycol monomethyl ether; ketones such as 2-heptanone, 2,6-dimethyl-4-heptanone and 2,5-dimethyl-4-hexanone; aliphatic hydrocarbons such as n-heptane, n-nonane, n-octane, n-decane, 2-methylheptane, 3-methylheptane, 3,3-dimethylhexane and 2,3,4-trimethylpentane, and fluorinated aliphatic hydrocarbons such as perfluoroheptane; and alcohols such as straight, branched or cyclic $C_4$-$C_9$ monohydric alcohol such as 1-butanol, 2-butanol, 3-methyl-1-butanol, isobutyl alcohol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol and 4-octanol; 2,2,3,3,4,4-hexafluoro-1-butanol, 2,2,3,3,4,4,5,5-octafluoro-1-pentanol and 2,2,3,3,4,4,5,5,6,6-decafluoro-1-hexanol, and $C_5$-$C_9$ fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol; toluene, anisole and mixtures containing one or more of these solvents. Of these organic solvents, alkyl propionates, alkyl butyrates and ketones, preferably branched ketones, are preferred and, more preferably, $C_8$-$C_9$ alkyl propionates, $C_8$-$C_9$ alkyl propionates, $C_8$-$C_9$ ketones, and mixtures containing one or more of these solvents. Suitable mixed solvents include, for example, mixtures of an alkyl ketone and an alkyl propionate such as the alkyl ketones and alkyl propionates described above. The solvent component of the composition is typically present in an amount of from 90 to 99 wt % based on the total composition.

The pattern treatment compositions can include one or more optional additives including, for example, surfactants and antioxidants. Such optional additives if used are each typically present in the composition in minor amounts such as from 0.01 to 10 wt % based on total solids of the composition.

Typical surfactants include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly(alkylene oxide) surfactants, and fluorochemical surfactants. Suitable non-ionic surfactants include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J. Nonionic surfactants that are acetylenic diol derivatives also can be suitable. Such surfactants are commercially available from Air Products and Chemicals, Inc. of Allentown, Pa. and sold under the trade names of SURFYNOL and DYNOL. Additional suitable surfactants include other polymeric compounds such as the tri-block EO-PO-EO co-polymers PLURONIC 25R2, L121, L123, L31, L81, L101 and P123 (BASF, Inc.).

The pattern treatment compositions are preferably free of cross-linkers such as typically used in acid diffusion resist growth processes. These processes are known to suffer from proximity and size bias, where, for example, isolated features shrink more than dense features due to the concentration of acid in the remaining photoresist. In addition to being free of cross-linkers, the pattern treatment compositions are preferably free of acids, acid generator compounds, for example, thermal acid generator compounds and photoacid generator compounds, as such compounds may limit the amount of trench/hole shrink achievable by the composition by reacting with the amine functionality of the block copolymer, thereby limiting the amount of such amine functionality available for interacting with the acid/alcohol of the resist pattern.

The pattern treatment compositions can be prepared following known procedures. For example, the compositions can be prepared by dissolving the block copolymer and other optional solid components of the composition in the solvent components. The desired total solids content of the compositions will depend on factors such as the particular polymer(s) in the composition and desired final layer thickness. Preferably, the solids content of the pattern treatment compositions is from 1 to 10 wt %, more preferably from 1 to 5 wt %, based on the total weight of the composition.

Photoresist Compositions

Photoresist compositions useful in the invention include, for example, chemically-amplified photoresist compositions comprising a matrix polymer that is acid-sensitive, meaning that as part of a layer of the photoresist composition, the resin and composition layer undergo a change in solubility in an organic developer as a result of reaction with acid generated by a photoacid generator following soft bake, exposure to activating radiation and post exposure bake. The change in solubility is brought about when acid-cleavable leaving groups such as photoacid-labile ester or acetal groups in the matrix polymer undergo an acid-catalyzed deprotection reaction on exposure to activating radiation and heat treatment to produce a carboxylic acid or an alcohol group. Suitable photoresist compositions useful for the invention are commercially available.

For imaging at certain sub-200 nm wavelengths such as 193 nm, the matrix polymer is typically substantially free (e.g., less than 15 mole %) or completely free of phenyl, benzyl or other aromatic groups where such groups are highly absorbing of the radiation. Preferable acid labile groups include, for example, acetal groups or ester groups that contain a tertiary non-cyclic alkyl carbon (e.g., t-butyl) or a tertiary alicyclic carbon (e.g., methyladamantyl) covalently linked to a carboxyl oxygen of an ester of the matrix polymer. Suitable matrix polymers further include polymers that contain (alkyl)acrylate units, preferably including acid-labile (alkyl)acrylate units, such as t-butyl acrylate, t-butyl methacrylate, methyladamantyl acrylate, methyl adamantyl methacrylate, ethylfenchyl acrylate, ethylfenchyl methacrylate, and the like, and other non-cyclic alkyl and alicyclic (alkyl)acrylates. Other suitable matrix polymers include, for example, those which contain polymerized units of a non-aromatic cyclic olefin (endocyclic double bond) such as an optionally substituted norbornene. The matrix resin typically includes one or more additional units formed from monomers providing one or more additional group chosen, for example, from lactone groups, polar groups and neutral groups. Blends of two or more of the above-described matrix polymers can suitably be used in the photoresist compositions.

Suitable matrix polymers for use in the photoresist compositions are commercially available and can readily be made by persons skilled in the art. The matrix polymer is present in the resist composition in an amount sufficient to render an exposed coating layer of the resist developable in a suitable developer solution. Typically, the matrix polymer is present in the composition in an amount of from 50 to 95 wt % based on total solids of the resist composition. The weight average molecular weight $M_w$ of the matrix polymer is typically less than 100,000, for example, from 5000 to 100,000, more typically from 5000 to 15,000.

The photoresist composition further comprises a photoacid generator (PAG) employed in an amount sufficient to generate a latent image in a coating layer of the composition upon exposure to activating radiation. For example, the photoacid generator will suitably be present in an amount of from about 1 to 20 wt % based on total solids of the photoresist composition. Typically, lesser amounts of the PAG will be suitable for chemically amplified resists as compared with non-chemically amplified materials.

Suitable PAGs are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. One or more of such PAGs can be used.

Suitable solvents for the photoresist compositions include, for example: glycol ethers such as 2-methoxyethyl ether (diglyme), ethylene glycol monomethyl ether, and propylene glycol monomethyl ether; propylene glycol monomethyl ether acetate; lactates such as methyl lactate and ethyl lactate; propionates such as methyl propionate, ethyl propionate, ethyl ethoxy propionate and methyl-2-hydroxy isobutyrate; Cellosolve esters such as methyl Cellosolve acetate; aromatic hydrocarbons such as toluene, anisole and xylene; and ketones such as acetone, methylethyl ketone, cyclohexanone and 2-heptanone. A blend of solvents such as a blend of two, three or more of the solvents described above also are suitable. The solvent is typically present in the composition in an amount of from 90 to 99 wt %, more typically from 95 to 98 wt %, based on the total weight of the photoresist composition.

The photoresist compositions can further include other optional materials. For example, the compositions can include one or more of actinic and contrast dyes, antistriation agents, plasticizers, speed enhancers, sensitizers, and the like. Such optional additives if used are typically present in the composition in minor amounts such as from 0.1 to 10 wt % based on total solids of the photoresist composition.

A preferred optional additive of the resist compositions is an added base. Suitable bases include, for example: linear and cyclic amides and derivatives thereof such as N,N-bis(2-hydroxyethyl)pivalamide, N,N-Diethylacetamide, N1,N1,N3,N3-tetrabutylmalonamide, 1-methylazepan-2-one, 1-allylazepan-2-one and tert-butyl 1,3-dihydroxy-2-(hydroxymethyl)propan-2-ylcarbamate; aromatic amines such as pyridine, and di-tert-butyl pyridine; aliphatic amines such as triisopropanolamine, n-tert-butyldiethanolamine, tris(2-acetoxy-ethyl) amine, 2,2',2",2'"-(ethane-1,2-diylbis(azanetriyl))tetraethanol, and 2-(dibutylamino)ethanol, 2,2',2"-nitrilotriethanol; cyclic aliphatic amines such as 1-(tert-butoxycarbonyl)-4-hydroxypiperidine, tert-butyl 1-pyrrolidinecarboxylate, tert-butyl 2-ethyl-1H-imidazole-1-carboxylate, di-tert-butyl piperazine-1,4-dicarboxylate and N (2-acetoxy-ethyl) morpholine. The added base is typically used in relatively small amounts, for example, from 0.01 to 5 wt %, preferably from 0.1 to 2 wt %, based on total solids of the photoresist composition.

Also a preferred optional additive for the resist compositions is a surfactant. Suitable surfactants include, for example, those described above with respect to the pattern treatment compositions. The surfactant is typically used in relatively small amounts, for example, from 0.01 to 5 wt %, preferably from 0.1 to 2 wt %, based on total solids of the photoresist composition.

The photoresists can be prepared following known procedures. For example, the resists can be prepared as coating compositions by dissolving the components of the photoresist in a suitable solvent, for example, one or more of: a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. The desired total solids content of the photoresist will depend on factors such as the particular polymers in the composition, final layer thickness and exposure wavelength. Typically the solids content of the photoresist varies from 1 to 10 wt %, more typically from 2 to 5 wt %, based on the total weight of the photoresist composition.

Suitable photoresists are known in the art and include, for example, photoresists described in US Patent Publications US20130115559A1, US20110294069A1, US20120064456A1, US20120288794A1, US20120171617A1, US20120219902A1 and U.S. Pat. No. 7,998,655B2.

Pattern Treatment Methods

Processes in accordance with the invention will now be described with reference to FIG. 1A-F, which illustrates an exemplary process flow for forming a photolithographic pattern by negative tone development. While an NTD process is exemplified for forming a photoresist pattern, it should be clear that the invention can be practiced with patterns formed by other processes and from other materials.

FIG. 1A depicts in cross-section a substrate 100 which can include various layers and features. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. One or more layers 102 to be selectively treated may be provided over the substrate 100. While the following description exemplifies etching as the selective treatment, the treatment can be, for example, an ion implantation, plating or other process. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be etched can be formed by various techniques, for example, chemical vapor deposition (CVD) such as plasma-enhanced CVD, low-pressure CVD or epitaxial growth, physical vapor deposition (PVD) such as sputtering or evaporation, or electroplating. The particular thickness of the one or more layers to be treated 102 will vary depending on the materials and particular devices being formed.

Depending on the particular layers to be etched, film thicknesses and photolithographic materials and process to be used, it may be desired to dispose over the layers 102 a hard mask layer and/or a bottom antireflective coating (BARC) over which a photoresist layer 104 is to be coated. Use of a hard mask layer may be desired, for example, with very thin resist layers, where the layers to be etched require a significant etching depth, and/or where the particular etchant has poor resist selectivity. Where a hard mask layer is used, the resist patterns to be formed can be transferred to the hard mask layer which, in turn, can be used as a mask for etching the underlying layers 102. Suitable hard mask materials and formation methods are known in the art. Typical materials include, for example, tungsten, titanium, titanium nitride, titanium oxide, zirconium oxide, aluminum oxide, aluminum oxynitride, hafnium oxide, amorphous carbon, silicon oxynitride and silicon nitride. The hard mask layer can include a single layer or a plurality of layers of different materials. The hard mask layer can be formed, for example, by chemical or physical vapor deposition techniques.

A bottom antireflective coating may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet light (300 nm or less), for example, KrF excimer laser light (248 nm) or ArF excimer laser light (193 nm). The antireflective coating can comprise a single layer or a plurality of different layers and can be formed from organic or inorganic materials. Suitable antireflective materials and methods of formation are known in the art. Antireflective materials are commercially available, for example, those sold under the AR™ trademark by Dow Electronic Materials (Marlborough, Mass. USA), such as AR™40A and AR™124 antireflectant materials.

A photoresist layer 104 formed from a composition such as described herein is disposed on the substrate over the antireflective layer (if present). The photoresist composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning A typical thickness for the photoresist layer 104 is from about 500 to 3000 Å.

The photoresist layer can next be soft baked to minimize the solvent content in the layer, thereby forming a tack-free coating and improving adhesion of the layer to the substrate. The soft bake can be conducted on a hotplate or in an oven, with a hotplate being typical. The soft bake temperature and time will depend, for example, on the particular material of the photoresist and thickness. Typical soft bakes are conducted at a temperature of from about 90 to 150° C., and a time of from about 30 to 90 seconds.

The photoresist layer 104 is next exposed to activating radiation 106 through a patterned photomask 108 to create a difference in solubility between exposed and unexposed regions. References herein to exposing a photoresist composition to radiation that is activating for the composition indicates that the radiation is capable of forming a latent image in the photoresist composition. The photomask has optically transparent and optically opaque regions corresponding to regions of the resist layer to remain and be removed, respectively, in a subsequent development step. The exposure wavelength is typically sub-400 nm, sub-300 nm or sub-200 nm, with 248 nm, 193 nm and EUV wavelengths (e.g., 13.5 nm) being typical. The methods find use in immersion or dry (non-immersion) lithography techniques. The exposure energy is typically from about 10 to 80 mJ/cm$^2$, dependent upon the exposure tool and the components of the photoresist composition.

Following exposure of the photoresist layer 104, a post-exposure bake (PEB) is performed. Acid generated by the acid generator causes cleavage of the acid cleavable leaving groups to form acid groups, typically carboxylic acid groups, and/or alcohol groups. The PEB can be conducted, for example, on a hotplate or in an oven. Conditions for the PEB will depend, for example, on the particular photoresist composition and layer thickness. The PEB is typically conducted at a temperature of from about 80 to 150° C., and a time of from about 30 to 90 seconds.

Figure 1B:
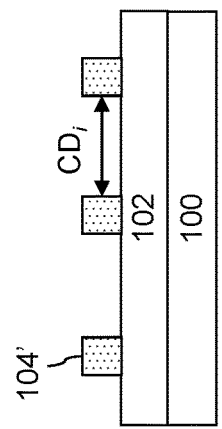

The exposed photoresist layer is next developed to remove unexposed regions, leaving exposed regions forming a negative resist pattern 104' as shown in FIG. 1B, having an initial critical dimension ($CD_i$). Resist pattern 104' includes the carboxylic acid group and/or the alcohol group. The negative tone developer is an organic solvent developer, for example, a solvent chosen from ketones, esters, ethers, hydrocarbons, and mixtures thereof. Suitable ketone solvents include, for example, acetone, 2-hexanone, 5-methyl-2-hexanone, 2-heptanone, 4-heptanone, 1-octanone, 2-octanone, 1-nonanone, 2-nonanone, diisobutyl ketone, cyclohexanone, methylcyclohexanone, phenylacetone, methyl ethyl ketone and methyl isobutyl ketone. Suitable ester solvents include, for example, methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate. Suitable ether solvents include, for example, dioxane, tetrahydrofuran and glycol ether solvents, for example, ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol. Suitable amide solvents include, for example, N-methyl-2-pyrrolidone, N,N-dimethylacetamide and N,N-dimethylformamide. Suitable hydrocarbon solvents include, for example, aromatic hydrocarbon solvents such as toluene, anisole and xylene. In addition, mixtures of these solvents, or one or more of the listed solvents mixed with a solvent other than those described above or mixed with water can be used. Other suitable solvents include those used in the photoresist composition. The developer is preferably 2-heptanone or a butyl acetate such as n-butyl acetate.

The organic solvent(s) are typically present in the developer in a combined amount of from 90 wt % to 100 wt %, more typically greater than 95 wt %, greater than 98 wt %, greater than 99 wt % or 100 wt %, based on the total weight of the developer.

The developer material may include optional additives, for example, surfactants such as described above with respect to the photoresist. Such optional additives typically will be present in minor concentrations, for example, in amounts of from about 0.01 to 5 wt % based on the total weight of the developer.

The developer can be applied to the substrate by known techniques, for example, by spin-coating or puddle-coating. The development time is for a period effective to remove the unexposed regions of the photoresist, with a time of from 5 to 30 seconds being typical. Development is typically conducted at room temperature.

Following development, the resist pattern 104' can optionally be heat treated in a hardbake process to further remove solvent from the resist pattern. The optional hardbake is typically conducted with a hot plate or oven, and is typically conducted at a temperature of about 90° C. or higher, for example, from about 100 to 150° C., and a time of from about 30 to 120 seconds.

Figure 1C:
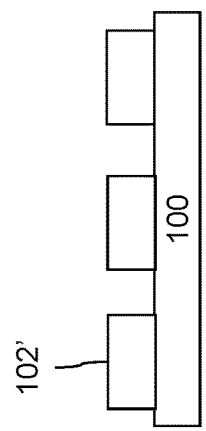

With reference to FIG. 1C, a pattern treatment composition as described herein is coated over the resist pattern 104' to form a pattern treatment composition layer 112. Depending on the particular process, the pattern treatment composition can be applied so as to cover the resist pattern entirely or to a height less than or equal to the thickness of the resist pattern so as not to cover the resist pattern top surface, depending on the particular application.

The pattern treatment composition layer 112 is typically next soft baked to remove solvent from the composition and to cause the polymer to diffuse and induce bonding between the anchoring portion of the polymer and the deprotected acid and/or alcohol group of the photoresist pattern. A typical soft bake for the pattern treatment composition is conducted at a temperature of from about 90 to 150° C., and a time of from about 30 to 120 seconds.

Figure 1D:
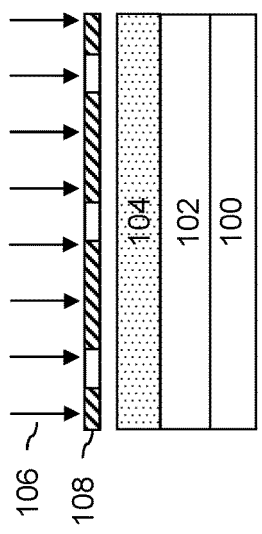

Residual pattern treatment composition including polymer that is not bonded to the resist pattern is next removed from the substrate by rinsing, leaving behind a layer 112' of the polymer bound to the resist pattern as shown in FIG. 1D. With removal of the residual pattern treatment composition, the effective thickness of the resist pattern sidewalls is increased, thereby reducing the spacing between adjacent lines or within a trench or hole pattern to a final critical dimension ($CD_f$). Suitable rinsing solutions include organic solvent developers in which the polymer is soluble. Suitable materials include, for example, those developers described herein with respect to the NTD developers. Of these, n-butyl acetate and 2-heptanone are typical. The resulting image typically has an improved (i.e., reduced) surface roughness as compared with that of the resist pattern following development of the photoresist layer.

Optionally, a post-rinse bake can be conducted at a temperature above the $T_g$ of the block copolymer. This bake can provide beneficial results, for example, in the form of improved pattern roughness or circularity due to the thermodynamic drive of the polymer to minimize its interfacial area with air.

Figure 1E:
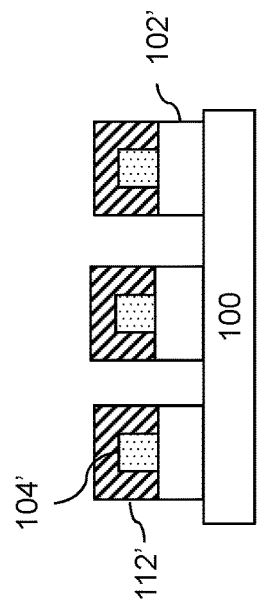
Figure 1F:
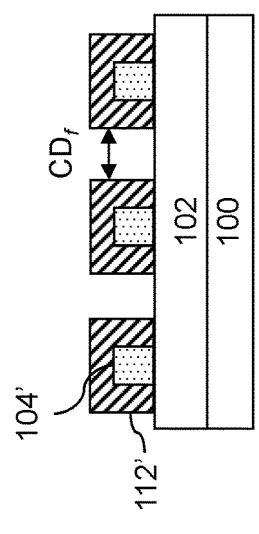

The one or more underlying layers 102 can next be selectively etched using the resist pattern 104' with bonded block copolymer 112' as an etch mask to expose the underlying substrate 100 as shown in FIG. 1E. Suitable etching techniques and chemistries for etching layers 102 are known in the art, with dry-etching processes such as reactive ion etching being typical. The resist pattern 104' and bonded block copolymer 112' are next removed from the substrate using known techniques, for example, an oxygen plasma ashing.

The following non-limiting examples are illustrative of the invention.

Examples

Number and weight-average molecular weights (Mn and Mw) and polydispersity (PDI) values (Mw/Mn) for the non-nitrogen-containing block polymers were measured by gel permeation chromatography (GPC) on a Waters alliance system equipped with a refractive index detector. Samples were dissolved in HPLC grade THF at a concentration of approximately 1 mg/mL and injected through four Shodex columns (KF805, KF804, KF803 and KF802). A flow rate of 1 mL/min and temperature of 35° C. were maintained. The columns were calibrated with narrow molecular weight PS standards (EasiCal PS-2, Polymer Laboratories, Inc.). For the nitrogen-containing block on the final block copolymers, the number average molecular weights Mn were calculated based on reactant feed charges and reported as "Mn Target".

Top-down scanning electron micrographs were acquired using a Hitachi S9380 SEM at 250K magnification. Cross-section SEM images were acquired after sectioning the wafer using an Amray 1910 SEM. Critical dimension (CD) and pitch were determined based on the SEM images.

Photoresist Composition A Preparation 17.73 g Matrix Polymer A (15 wt % in PGMEA), 16.312 g PAG A solution (1 wt % in methyl-2-hydroxy isobutyrate), 3.463 g PAG B solution (1 wt % in PGMEA), 6.986 g PAG C solution (2 wt % in methyl-2-hydroxyisobutyrate), 4.185 g trioctylamine (1 wt % solution in PGMEA), 0.248 g Polymer Additive A (25 wt % solution in PGMEA), 25.63 g PGMEA, 9.69 g gamma-butyrolactone and 22.61 g methyl-2-hydroxyisobutyrate were mixed and filtered through a 0.2 μm Nylon filter.

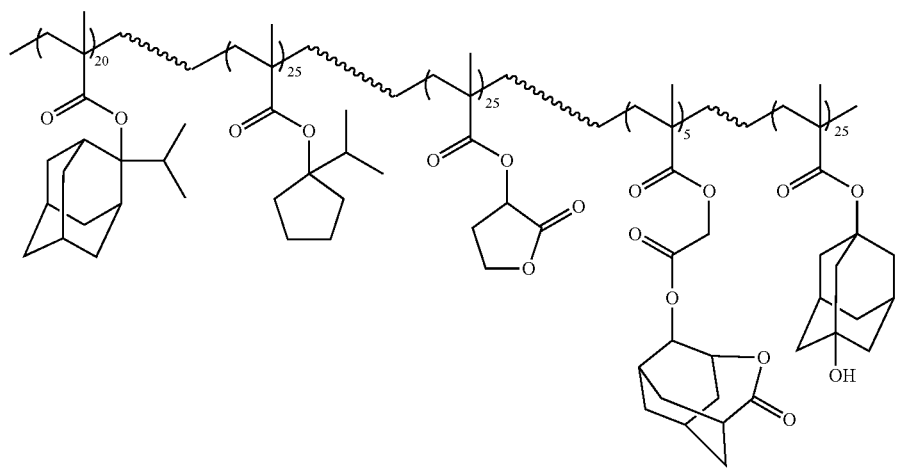
Matrix Polymer A
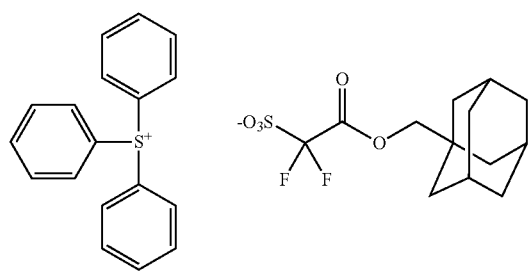
PAG A
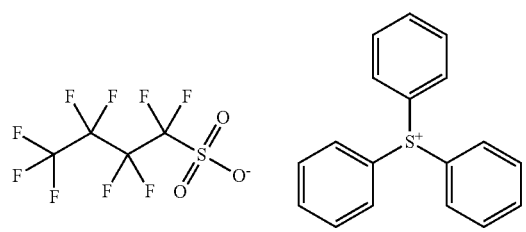
PAG B
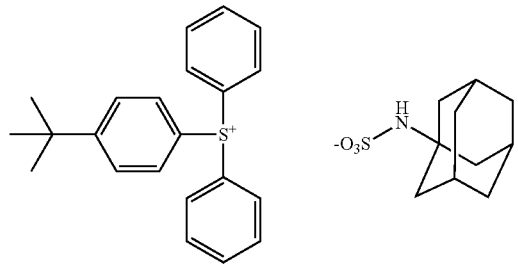
PAG C
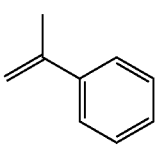
Polymer Additive A
Pattern Treatment Composition Preparation
The following monomers were used to prepare pattern treatment composition Polymers P-1 to P-11 as described below.
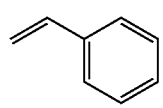
M1
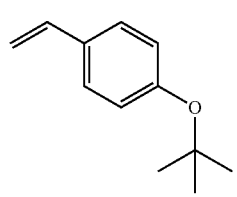
M2
-continued
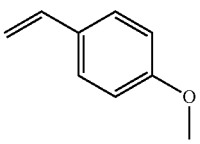
M3
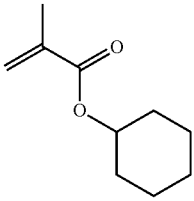
M4
M5

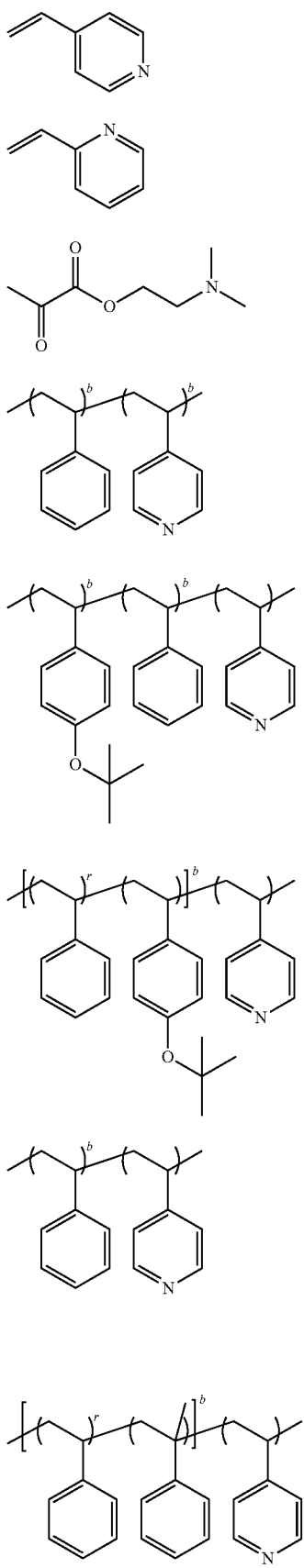
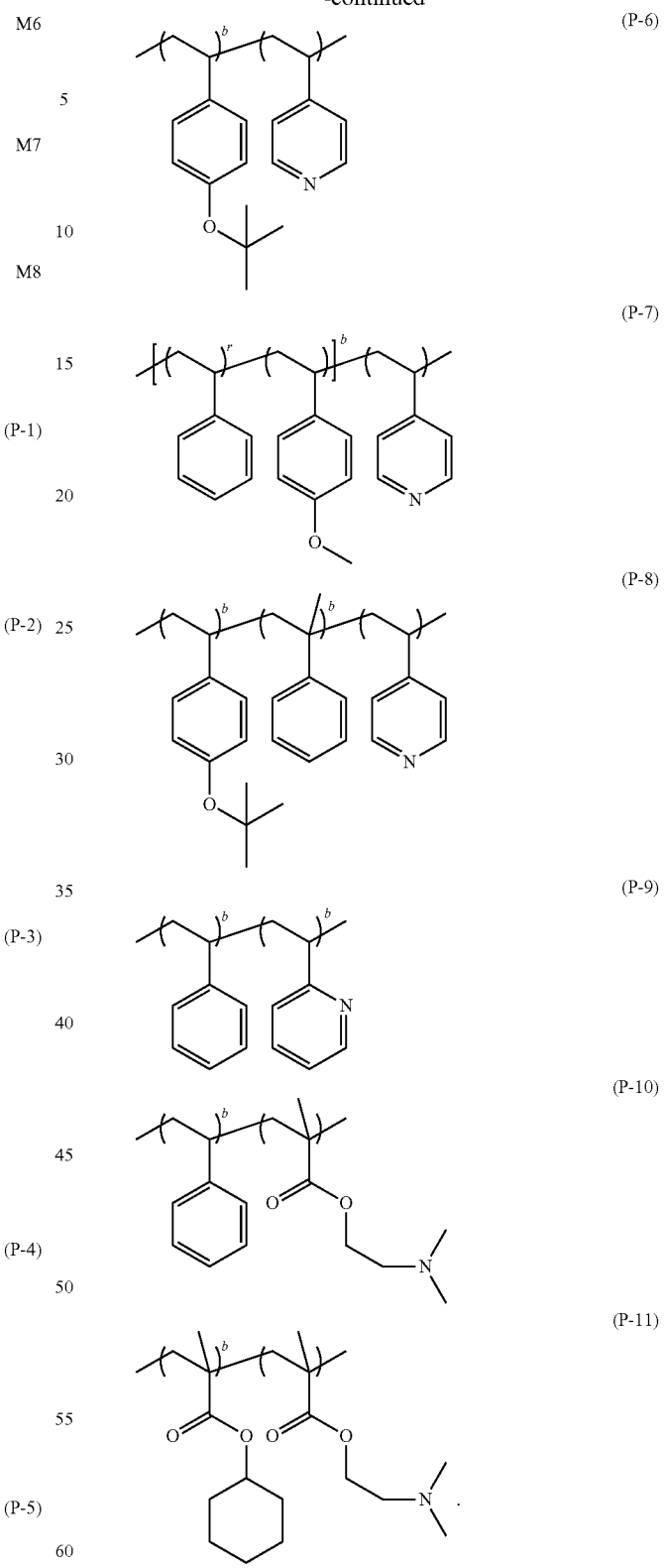
Polymer Synthesis
Polymer Synthesis Procedure 1:
Polymers P-1, P-4, P-6 and P-9 were synthesized using the materials and amounts set forth in Table 1. The monomers and solvents were sparged with ultrahigh purity argon to remove oxygen. The monomers were further purified prior to use with activated Al$_2$O$_3$ and were diluted with cyclohexane to about 50 vol % concentration. An amount of THF required for a reaction concentration of about 7-10 wt % solids was transferred to a reactor. The contents were cooled to −78° C. in a dry ice/isopropanol bath. The THF was titrated with sec-butyl lithium (SBL) initiator in 0.7M cyclohexane until a green color was observed. The reaction bath was warmed to room temperature until the green color fully disappeared. The reaction bath was again cooled to −78° C. followed by addition of SBL initiator to yield a yellow color. A first monomer ("Monomer A") was fed to the reactor and the contents were stirred for one hour. A reaction aliquot was collected by cannulating the polymer mixture in oxygen-free methanol. The precipitated polymer was analyzed by GPC for Mn. A second monomer ("Monomer B") was added to the reactor and the mixture was stirred for an additional two hours at −78° C. The reaction was then quenched by addition of oxygen-free methanol. The reaction product was precipitated out in methanol to yield a powdery white precipitate which was vacuum-dried in an oven at 50° C. for eight hours to yield a dry polymer as Polymers P-1, P-4, P-6 and P-9.

Polymer Synthesis Procedure 2:

Polymers P-2 and P-8 were synthesized using the materials and amounts set forth in Table 1, and using Polymer Synthesis Procedure 1 with the following modifications. After one hour reaction of the first monomer ("Monomer A"), a second monomer ("Monomer B") was fed to the reactor and the contents were stirred for an additional one hour. A reaction aliquot was collected by cannulating the polymer mixture in oxygen-free methanol. Then, a third monomer ("Monomer C") was fed to the reactor and the synthesis continued following Polymer Synthesis Procedure 1 to give polymers P-2 and P-8.

Polymer Synthesis Procedure 3:

Polymers P-3, P-5 and P-7 were synthesized using the materials and amounts set forth in Table 1, and using Polymer Synthesis Procedure 1 with the following modifications. After SBL addition, first and second monomers ("Monomer A" and "Monomer B") were pre-mixed and fed to the reactor and the contents were stirred for one hour. A reaction aliquot was collected by cannulating the polymer mixture in oxygen-free methanol. The precipitated polymer was analyzed by GPC for Mn. A third monomer ("Monomer C") was added to the reactor and the synthesis continued following Procedure 1 to give Polymers P-3, P-5 and P-7.

Polymer Synthesis Procedure 4:

Polymer P-10 was synthesized using the materials and amounts set forth in Table 1. The monomers and solvents were freeze-pump-thawed three times to remove oxygen. The monomers were further purified prior to use with activated Al$_2$O$_3$ and were diluted with cyclohexane to about 50 vol % concentration. An amount of THF required for a reaction concentration of about 7-10 wt % solids was transferred to a reactor containing pre-dried LiCl. The contents were cooled to −78° C. in a dry ice/isopropanol bath. The THF was titrated with sec-butyl lithium (SBL) initiator in 0.7M cyclohexane until a green color was observed. The reaction bath was warmed to room temperature until the green color fully disappeared. The reaction bath was again cooled to −78° C. followed by addition of SBL initiator to yield a yellow color. A first monomer ("Monomer A") was fed to the reactor and the contents were stirred for one hour. A reaction aliquot was collected by cannulating the polymer mixture in oxygen-free methanol. The precipitated polymer was analyzed by GPC for Mn. Diphenyl ethylene (DPE) was then charged into the reactor and the mixture was stirred for 5 min. A second monomer ("Monomer B") was added to the reactor and the mixture was stirred for an additional four hours at −78° C. The reaction was then quenched by addition of oxygen-free methanol. The reaction product was precipitated out in methanol to yield a powdery white precipitate which was vacuum-dried in an oven at 50° C. for eight hours to yield a dry polymer as Polymer P-10.

Polymer Synthesis Procedure 5:

Polymer P-11 was synthesized using the materials and amounts set forth in Table 1. The monomers and solvents were freeze-pump-thawed three times to remove oxygen. The monomers were further purified prior to use with activated Al$_2$O$_3$ and were diluted with cyclohexane to about 50 vol % concentration. An amount of THF required for a reaction concentration of about 7-10 wt % solids was transferred to a reactor containing pre-dried LiCl. The contents were cooled to −78° C. in a dry ice/isopropanol bath. The THF was titrated with sec-butyl lithium (SBL) initiator in 0.7M cyclohexane until a green color was observed. The reaction bath was warmed to room temperature until the green color fully disappeared. The reaction bath was again cooled to −78° C. followed by addition of diphenyl ethylene (DPE) and SBL initiator to yield a bright red color. First monomer ("Monomer A") was fed to the reactor and the contents were stirred for four hours. A reaction aliquot was collected by cannulating the polymer mixture in oxygen-free methanol. The precipitated polymer was analyzed by GPC for Mn. A second monomer ("Monomer B") was added to the reactor and the mixture was stirred for four hours at −78° C. The reaction was then quenched by addition of oxygen-free methanol. The reaction product was precipitated out in methanol to yield a powdery white precipitate, which was vacuum-dried in an oven at 50° C. for eight hours to yield a dry polymer as Polymer P-11.

TABLE 1

| Polymer | Mn (kDa) | PDI | Mn Target (kDa) | SBL | DPE | Monomer A | Monomer B | Monomer C |
|---|---|---|---|---|---|---|---|---|
| P-1(A) | 30.4 | 1.09 | 2.5 | 18.2 mL (0.46M) | | M1 (209.1 g) | M6 (20.9 g) | |
| P-1(B) | 36.6 | 1.08 | 3.5 | 11.64 mL (0.46M) | | M1 (201.7 g) | M6 (18.3 g) | |
| P-2 | 48.1 | 1.04 | 3.0 | 0.51 mL (0.46M) | | M2 (0.9 g) | M1 (8.4 g) | M6 (0.7 g) |
| P-3 | 41.1 | 1.08 | 3.0 | 0.35 mL (0.46M) | | M1 (4.6 g) | M2 (1.9 g) | M6 (0.5 g) |
| P-4 | 32.1 | 1.14 | 3.5 | 0.83 mL (0.46M) | | M3 (18.7 g) | M6 (1.3 g) | |
| P-5 | 27.5 | 1.14 | 2.0 | 0.65 mL (0.46M) | | M1 (4.8 g) | M3 (4.8 g) | M6 (0.6 g) |

TABLE 1-continued

| Polymer | Mn (kDa) | PDI | Mn Target (kDa) | SBL | DPE | Monomer A | Monomer B | Monomer C |
|---|---|---|---|---|---|---|---|---|
| P-6 | 75.1 | 1.14 | 3.0 | 0.35 mL (0.46M) | | M2 (9.52 g) | M6 (0.48 g) | |
| P-7 | 36.2 | 1.10 | 3.0 | 0.38 mL (0.46M) | | M1 (5.3 g) | M4 (1.2 g) | M6 (0.5 g) |
| P-8 | 22.3 | 1.17 | 3.0 | 1.32 mL (0.46M) | | M2 (1.8 g) | M3 (16.4 g) | M6 (1.8 g) |
| P-9 | 29.7 | 1.05 | 2.5 | 1.00 mL (0.46M) | | M1 (13.9 g) | M7 (1.2 g) | |
| P-10 | 37.7 | 1.21 | 3.5 | 0.85 mL (0.46M) | 0.16 g | M1 (13.6 g) | M8 (1.4 g) | |
| P-11 | 57.7 | 1.07 | 3.5 | 1.15 mL (0.37M) | 0.16 g | M5 (18.5 g) | M8 (1.5 g) | |

Mn = Mn for non-nitrogen-containing block; PDI = PDI for non-nitrogen-containing block; Mn Target = Mn for nitrogen-containing block calculated based on reactant feed charges; SBL = sec-butyl lithium; DPE = diphenyl ethylene.

Pattern Treatment Composition Preparation:

Pattern treatment compositions were prepared by dissolving the polymers set forth in Table 2 in 2-heptanone in amount to form 3 wt % solutions. The compositions were filtered with a 0.2 micron ultra-high molecular weight polyethylene (UPE) filter.

TABLE 2

| Example | Pattern Treatment Composition | Polymer No. | Polymer |
|---|---|---|---|
| 1 | PTC-1 | P-1(A) | P(M1)-b-P(M6) |
| 2 | PTC-2 | P-1(B) | P(M1)-b-P(M6) |
| 3 | PTC-3 | P-2 | P(M2)-b-P(M1)-b-P(M6) |
| 4 | PTC-4 | P-3 | P(M1-r-M2)-b-P(M6) |
| 5 | PTC-5 | P-4 | P(M3)-b-P(M6) |
| 6 | PTC-6 | P-5 | P(M1-r-M3)-b-P(M6) |
| 7 | PTC-7 | P-6 | P(M2)-b-P(M6) |
| 8 | PTC-8 | P-7 | P(M1-r-M4)-b-P(M6) |
| 9 | PTC-9 | P-8 | P(M2)-b-P(M3)-b-P(M6) |
| 10 | PTC-10 | P-1(A)/P-6* | P(M1)-b-P(M6)/P(M2)-b-P(M6) |
| 11 (Comp.) | PTC-11 | P-9 | P(M1)-b-P(M7) |
| 12 (Comp.) | PTC-12 | P-10 | P(M1)-b-P(M8) |
| 13 (Comp.) | PTC-13 | P-11 | P(M5)-b-P(M8) |

*50/50 wt % ratio.

Lithographic Processing and Pattern Treatment:
Line/Space Pattern Treatment

Figure 2:
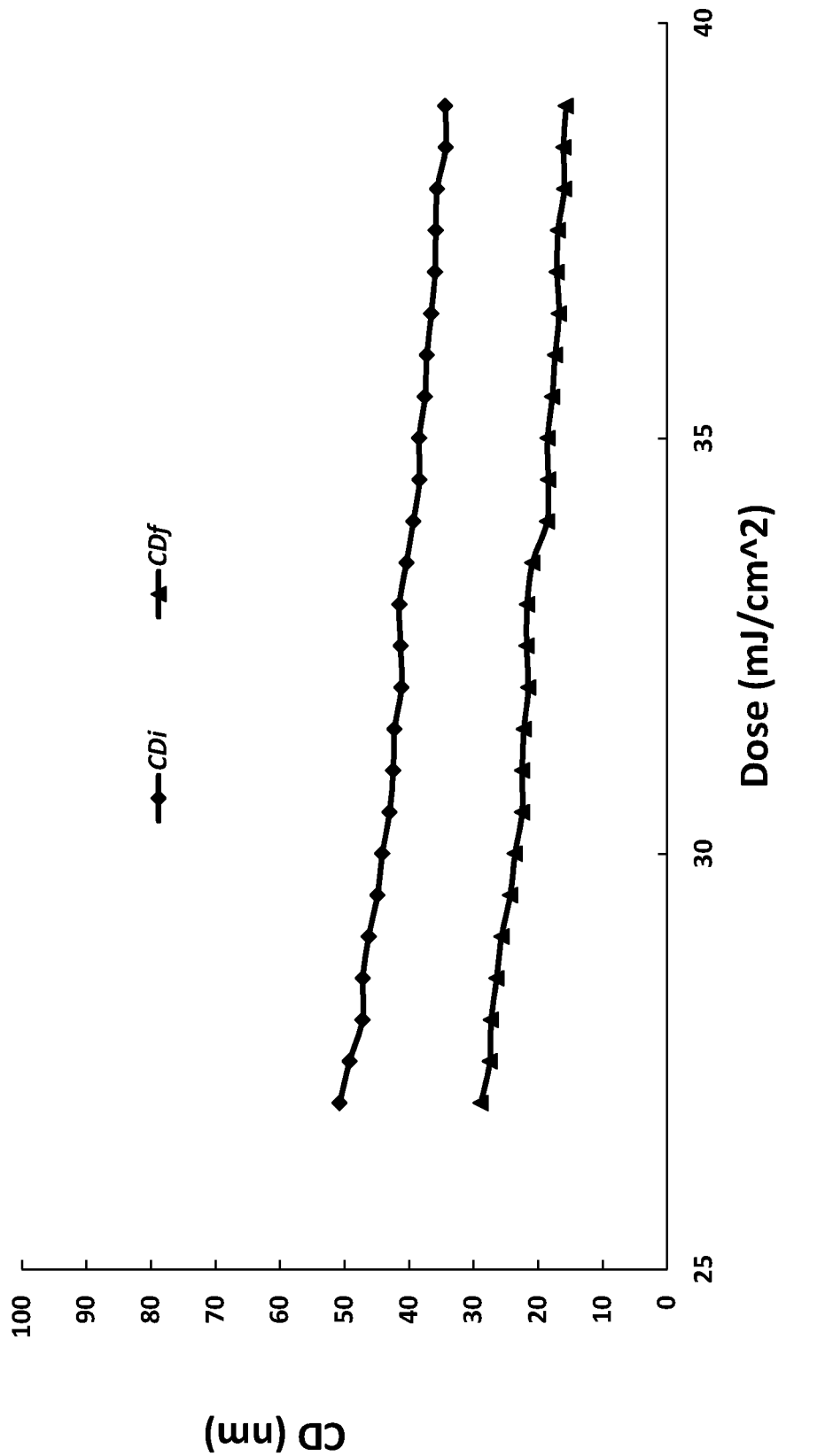
FIG. 2 is a plot of CD as a function of dose for photoresist patterns before and after treatment with a pattern treatment composition in accordance with the invention.

Silicon wafers having line/space patterns were prepared and processed as follows. Eight-inch silicon wafers having a bilayer stack of 220 Å silicon-containing antireflective coating (SiARC) layer over 1350 Å organic underlayer were provided. Photoresist Composition A was coated over the bilayer stack and soft baked at 90° C. for 60 seconds on a TEL CLEAN TRACK™ LITHIUS™ i+ coater/developer, to a target resist thickness of 1000 Å. The photoresist layer was exposed using an ASML 1900i scanner with a numerical aperture (NA) of 1.3 and Dipole-35Y illumination through a reticle including line/space patterns with a pitch of 90 nm at various doses across each wafer. A post-exposure bake was performed at 90° C. for 60 seconds, and the photoresist layer was developed using an n-butylacetate developer to form line/space patterns with a pitch of 90 nm and various critical dimensions (CDs) across the wafers. One of the resist-patterned wafers was observed by SEM as a control without further processing, and the average spacing between lines ($CD_i$) was measured. Other wafers were overcoated with a respective pattern treatment composition designated in Table 3 by spin coating at 1500 rpm on a TEL CLEAN TRACK™ LITHIUS™ i+ coater/developer. The patterned wafers were soft baked at 100° C. for 60 seconds, and rinsed with n-butylacetate on a spin-coater. The resulting patterns were observed by SEM and the average spacing between lines ($CD_f$) was measured at mid-height of the pattern. The average shrink amount $\Delta CD$ ($=CD_i-CD_f$) for the pattern treatment compositions was calculated. The results are shown in Table 3 for $CD_i=45$ nm. CD as a function of exposure dose before and after pattern treatment was also determined for pattern treatment compositions of the invention. The shrink amount ($\Delta CD$) at each dose over the ranges measured for the compositions was found to be substantially constant, indicating low proximity bias. FIG. 2 provides a representative plot of CD versus exposure dose before pattern treatment ($CD_i$) and after pattern treatment ($CD_f$) for pattern treatment composition PTC-1.

Etch Rate Analysis

Silicon wafers were prepared and processed as follows. Eight-inch silicon wafers were primed with hexamethyldisilazane prior to being coated with photoresist. Photoresist Composition A was coated and soft baked at 90° C. for 60 seconds to form a photoresist film having a thickness of 700 nm. The photoresist layer was exposed using an ASML 1100 scanner with a numerical aperture (NA) of 0.75 and Dipole-35Y illumination through a reticle including a checkerboard pattern with 50 mJ/cm² dose across each wafer. A post-exposure bake was performed at 90° C. for 60 seconds, and the photoresist layer was developed using n-butyl acetate developer. Wafers were overcoated with a respective pattern treatment composition designated in Table 3, soft baked at 100° C. for 60 seconds, and developed with n-butyl acetate to form an overcoat film having a thickness of 60 Å. The wafers were treated with oxygen plasma (6 mT pressure, 25 sscm $O_2$ flow, 50 W) for times of 0, 4, 8, 12 and 40 seconds, respectively, using a Plasma-Therm 790 RIE etcher (Plasma Therm Co.). Film thicknesses were measured for each wafer using a Thermawave 7 and etch rates were calculated as change in film thickness divided by etching time. The etch rates are provided in Table 3, which table also provides the Ohnishi parameters for each of the polymers.

TABLE 3

| Example | Composition | Polymer | ΔCD (nm) | Etch Rate (Å/s) | Ohnishi Parameter |
|---|---|---|---|---|---|
| 14 | PTC-1 | P-1(A) | 19.9 | | 2.01 |
| 15 | PTC-2 | P-1(B) | 25.8 | 3.5 | 2.01 |
| 16 | PTC-3 | P-2 | 22.3 | 3.9 | 2.06 |
| 17 | PTC-4 | P-3 | 19.1 | | 2.16 |

TABLE 3-continued

| Example | Composition | Polymer | ΔCD (nm) | Etch Rate (Å/s) | Ohnishi Parameter |
|---|---|---|---|---|---|
| 18 | PTC-5 | P-4 | 39.3 | | 2.11 |
| 19 | PTC-6 | P-5 | 21.6 | | 2.06 |
| 20 | PTC-7 | P-6 | 17.7 | | 2.61 |
| 21 | PTC-8 | P-7 | 20.0 | | 2.08 |
| 22 | PTC-9 | P-8 | 24.2 | | 2.15 |
| 23 | PTC-10 | P-1(A)/P-6* | 19.3 | | 2.31** |
| 24 (Comp.) | PTC-11 | P-9 | 16.3 | 4.0 | 2.01 |
| 25 (Comp.) | PTC-12 | P-10 | 13.3 | | 2.11 |
| 26 (Comp.) | PTC-13 | P-11 | 17.9 | 7.2 | 3.55 |

*50/50 wt % ratio.
**Ohnishi Parameter calculated by weighted average of individual polymers based on their respective weight ratios.

What is claimed is:

1. A pattern treatment method, comprising:
   (a) providing a semiconductor substrate comprising a patterned feature on a surface thereof;
   (b) applying a pattern treatment composition to the patterned feature, wherein the pattern treatment composition comprises: a block copolymer and an organic solvent, wherein the block copolymer comprises: (i) a first block comprising a first unit formed from 4-vinylpyridine, and (ii) a second block comprising a first unit formed from a vinyl aromatic monomer; and
   (c) removing residual pattern shrink composition from the substrate, leaving a coating of the block copolymer over the surface of the patterned feature, thereby providing a reduced pattern spacing as compared with a pattern spacing of the patterned feature prior to coating the pattern treatment composition.

2. The pattern treatment method of claim 1, wherein the patterned feature is a photoresist pattern.

3. The pattern treatment method of claim 2, wherein the photoresist pattern is formed by a negative tone development process comprising:
   (a1) applying a layer of a photoresist composition over the semiconductor substrate, wherein the photoresist composition comprises: a resin comprising an acid cleavable leaving group, the cleavage of which forms an acid group and/or an alcohol group; a photoacid generator; and a solvent;
   (a2) exposing the photoresist layer to activating radiation through a patterned photomask;
   (a3) heating the photoresist layer, wherein acid generated by the acid generator causes cleavage of the acid cleavable leaving group, thereby forming the acid group and/or the alcohol group; and
   (a4) developing the exposed photoresist composition layer with an organic solvent developer to form a negative photoresist pattern comprising an acid group and/or an alcohol group.

4. The pattern treatment method of claim 1, wherein the vinyl aromatic monomer is of the following general formula (I):

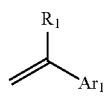

(I)

wherein: $R_1$ is chosen from hydrogen and C1 to C3 alkyl or haloalkyl; and $Ar_1$ is chosen from optionally substituted aryl groups, optionally including one or more linking moiety chosen from —O—, —S—, —C(O)O— and —OC(O)—.

5. The pattern treatment method of claim 4, wherein the vinyl aromatic monomer is styrene.

6. The pattern treatment method of claim 5, wherein the block copolymer is poly(4-vinylpyridine)-b-polystyrene.

7. The pattern treatment method of claim 1, wherein the vinyl aromatic monomer comprises fused aromatic rings.

8. The pattern treatment method of claim 1, wherein all repeat units of the first block are formed from 4-vinylpyridine.

9. The pattern treatment method of claim 1, wherein the second block further comprises a second unit formed from a monomer that is different from the vinyl aromatic monomer of the first unit.

10. The pattern treatment method of claim 1, wherein the block copolymer further comprises a third block comprising a unit formed from a vinyl aromatic monomer.

11. The pattern treatment method of claim 1, wherein the pattern treatment composition further comprises a second polymer that is different from the block copolymer.

* * * * *